United States Patent
Reynolds et al.

(12) 
(10) Patent No.: US 6,661,812 B1
(45) Date of Patent: Dec. 9, 2003

(54) BIDIRECTIONAL BUS FOR USE AS AN INTERCONNECT ROUTING RESOURCE

(75) Inventors: Bart Reynolds, Seattle, WA (US); Sridhar Krishnamurthy, San Jose, CA (US)

(73) Assignee: Triscend Corporation, Mountain View, CA (US)

( * ) Notice: Subject to any disclaimer, the term of this patent is extended or adjusted under 35 U.S.C. 154(b) by 0 days.

(21) Appl. No.: 09/543,292

(22) Filed: Apr. 5, 2000

(51) Int. Cl.$^7$ .................................................. H04J 3/02
(52) U.S. Cl. .......................................... 370/537; 326/82
(58) Field of Search ................................ 370/537, 532, 370/535, 539, 541, 357, 359, 360, 538, 540; 326/38, 39, 82, 90, 7, 40, 86, 104, 114; 710/20, 21, 27, 31, 38, 51, 115, 126, 127, 128

(56) References Cited

U.S. PATENT DOCUMENTS

| | | | |
|---|---|---|---|
| 5,600,271 A | | 2/1997 | Erickson et al. |
| 5,677,638 A | | 10/1997 | Young et al. |
| 5,847,580 A | * | 12/1998 | Bapat et al. ................. 326/82 |
| 5,936,424 A | | 8/1999 | Young et al. |
| 6,055,597 A | * | 4/2000 | Houg ......................... 710/127 |
| 6,078,191 A | * | 6/2000 | Chan et al. .................. 326/40 |
| 6,167,559 A | * | 12/2000 | Furtek et al. ................. 716/16 |
| 6,173,342 B1 | * | 1/2001 | Tsunoda et al. ............... 710/8 |
| 6,256,342 B1 | * | 7/2001 | Schlag et al. ............... 375/229 |

FOREIGN PATENT DOCUMENTS

WO    WO 00/22546    4/2000

* cited by examiner

Primary Examiner—Douglas Olms
Assistant Examiner—Phirin Sam
(74) Attorney, Agent, or Firm—Blakely, Sokoloff, Taylor & Zafman LLP

(57) ABSTRACT

A bidirectional bus structure includes a first multiplexer path propagating signals in a first direction and a second multiplexer path propagating signals in a second direction. For one embodiment, the bus structure further includes a circuit for selectively combining the signals on the first and second paths and selectively propagating the signal on one of the first and second paths. For another embodiment, the bus structure further includes a logic gate for combining the signals on the first and second paths and a circuit for selectively propagating the signal on one of the first path, the second path, and an output signal of the logic gate. For both embodiments, the present invention allows multiple signals to use the bus without contention, thereby providing an extremely flexible interconnect routing resource. This bidirectional bus can selectively drive signals onto the general interconnect as well as onto a system bus in a configurable system on a chip.

18 Claims, 4 Drawing Sheets

BIDIRECTIONAL BUS FOR USE AS AN INTERCONNECT ROUTING RESOURCE

FIELD OF THE INVENTION

The present invention relates to a bus structure, and, more particularly, to a bidirectional bus structure that can selectively function as an interconnect routing resource.

BACKGROUND

A programmable logic device ("PLD") is customized in its package to provide particular, user-defined logic functions. In a typical PLD, a programmable interconnect (also called general interconnect) connects various programmable elements of the PLD, such as logic blocks or input/output blocks, to implement those logic functions. The general interconnect includes many routing resources, such as buses, to efficiently provide the necessary signals to the elements of the PLD.

Bus structures in PLDs are well known in the art. For example, illustrative bus structures are described in U.S. Pat. Nos. 5,677,638, 5,847,580, and 5,936,424.

FIG. 1 shows a prior art bidirectional multiplexer chain 100 in a simplified circuit diagram. Note that only one link of the "chain" is shown. The complete chain includes N number of links, where N is typically in the tens or hundreds. Thus, lines 112 and 113 in a first link are connected to lines 111 and 114 in a second, adjoining link, respectively. Bidirectional multiplexer chain 100 includes a multiplexer 101 which selectively transfers a signal on line 113 or line 110 to line 114. This propagation direction is arbitrarily designated as East. In contrast, a multiplexer 102 selectively transfers a signal on line 111 or line 110 to line 112. This propagation direction is arbitrarily designated as West.

Line 110 is coupled to a bus driver 103, which is typically a look-up table or a flip-flop in a PLD. The pair of multiplexers within each link of bidirectional multiplexer chain 100, such as multiplexers 101 and 102, are controlled by the same control signal, dsel. Control signal dsel is typically provided by a combination of configuration memory cells and user select signals.

Thus, depending on the respective control signal dsel, each multiplexer 101/102 within a link can selectively get its input signal from bus driver 103 or from the adjacent multiplexer in its respective path (i.e., the East path or the West path). When multiplexers 101 and 102 are programmed to transfer the signal from bus driver 103, the multiplexers are said to be in the inject mode, and when the multiplexers are programmed to transfer the signal from multiplexers in adjacent links, the multiplexers are said to be in the bypass mode.

An OR gate 104 receives its input signals from multiplexers 101 and 102 and provides its output signal to general interconnect 105. To be used as an interconnect routing resource, one set of multiplexers 101 and 102 drives a signal from their respective driver 103 onto the East and West paths (the inject mode). All other sets of multiplexers 101 and 102 in bidirectional multiplexer chain 100 are programmed to propagate signals from adjacent links (the bypass mode). Typically, many OR gates 104, also called tap points, are placed along the length of bidirectional multiplexer chain 100, thereby ensuring that the propagated signal is easily accessible to nearby logic via general interconnect 105. In this manner, bidirectional multiplexer chain 100 provides a large number of drivers while maintaining switching speed and flexibility in routability.

When bidirectional multiplexer chain 100 is used as an interconnect resource, however, both the East and the West paths are "dedicated" to propagating a single signal. No other signal can use bidirectional multiplexer chain 100 without causing signal contention.

SUMMARY AND OBJECTS OF THE INVENTION

One of the objects of the invention is to provide a flexible, bi-directional multiplexer chain that allows multiple signals to use the multiplexer chain as an alternate interconnect routing resource.

A bus structure is described. The bus structure includes a bi-directional multiplexer chain. Each link of the chain includes a first multiplexer propagating signals in a first direction and a second multiplexer propagating signals in a second direction. The bus structure also includes a circuit for selectively combining output signals of the first and second multiplexers and selectively propagating an output signal of one of first and second multiplexers.

Other features and advantages of the present invention will be apparent from the accompanying drawings and from the detailed description that follow below.

BRIEF DESCRIPTION OF THE DRAWINGS

The present invention is illustrated by way of example and not limitation in the figures of the accompanying drawings in which like references indicate similar elements and in which.

DETAILED DESCRIPTION

A bidirectional bus structure includes a first path propagating signals in a first direction and a second path propagating signals in a second direction. In one embodiment of the present invention, the bus structure further includes a multiplexer circuit for selectively propagating the signals on the first and second paths, selectively propagating the signal from one of the first and second paths, and selectively ignoring signals from both first and second paths and instead driving a predetermined output signal. In one embodiment, the multiplexer circuit includes a first multiplexer for receiving a signal on the first path and a predetermined signal, a second multiplexer for receiving a signal on the second path and the predetermined signal, and a logic gate for receiving output signals of the first and second multiplexers.

In this configuration, if only the first multiplexer selectively drives the predetermined signal to the logic gate, then the logic gate provides the signal on the second path as an output signal. In a similar manner, if only the second multiplexer selectively drives the predetermined signal to the logic gate, then the logic gate provides the signal on the first path as an output signal. The predetermined signal is provided as an output signal if both multiplexers drive the predetermined signal to the logic gate. Finally, if both multiplexers drive the signals on the first and second paths to the logic gate, then the logic gate outputs a combined signal.

In another embodiment of the present invention, the bus structure further includes a logic gate for propagating the signals on the first and second paths and a multiplexer circuit for selectively propagating the signal from one of the first path, the second path, and an output signal of the logic gate. The multiplexer circuit includes two multiplexers. The first multiplexer receives the signal on the first path and the signal on the second path. The second multiplexer receives the output signals from the logic gate and the first multiplexer. In this embodiment, an output signal is provided from one of the first path, the second path, or a combined signal is generated from both paths.

Thus, in either embodiment of the present invention, multiple signals can use the bidirectional bus, thereby maximizing flexibility in using the bidirectional bus as an interconnect routing resource.

Figure 2:
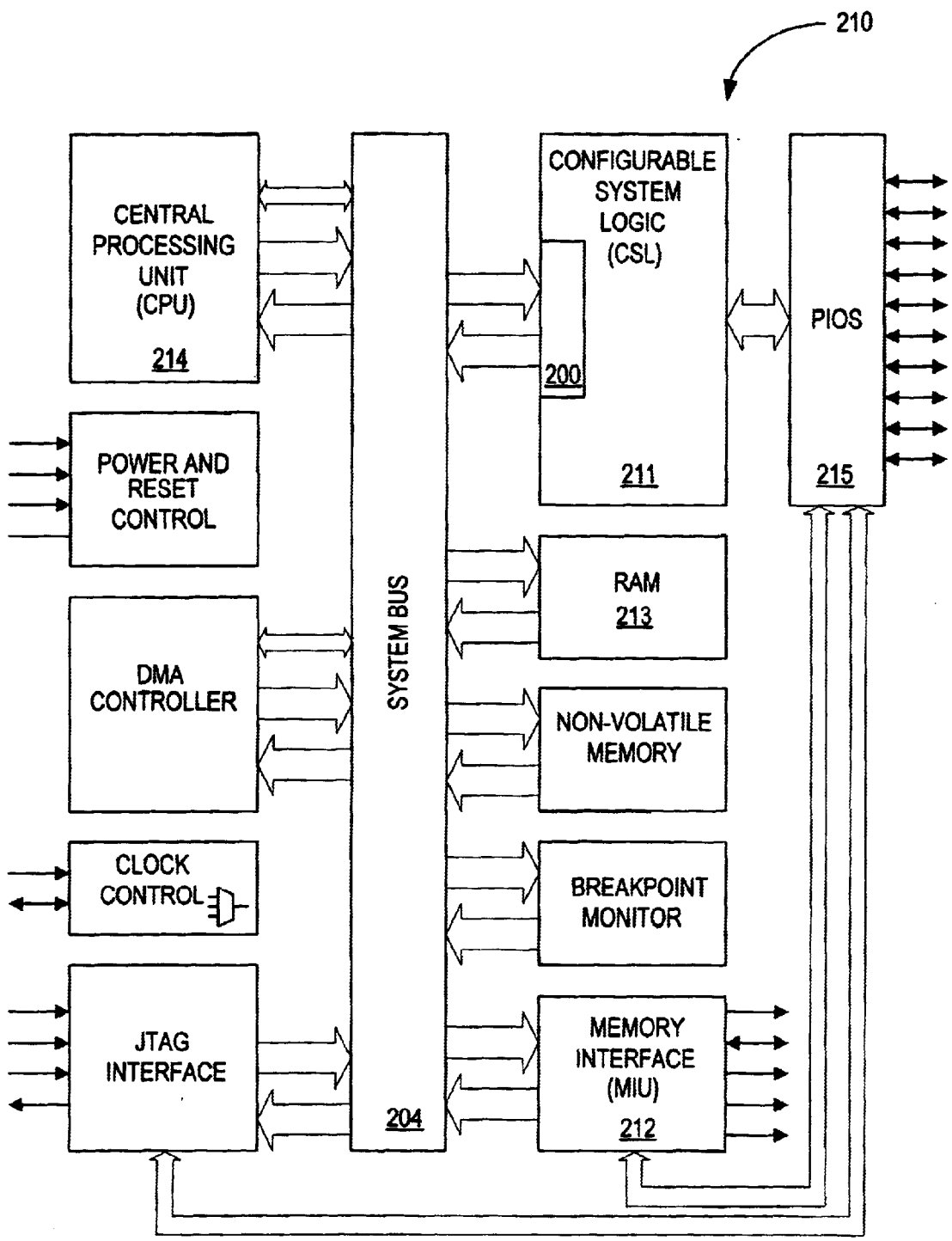
FIG. 2 is a block diagram of a configurable system on a chip ("CSoC") that includes a bidirectional bus structure.

A configurable system on a chip ("CSoC") is a monolithic, integrated circuit device that performs a variety of microcontroller and programmable logic functions. FIG. 2 illustrates the major structures of a CSoC 210. CSoC 210 includes configurable system logic ("CSL") 211, which is a programmable logic section to implement user-defined logic. CSL 211 typically includes logic blocks connected by a general interconnect, both the logic blocks and the general interconnect being programmed by loading configuration memory cells (not shown). A memory interface unit (MIU) 212 facilitates the transfer of the logic values for the configuration memory cells from an external memory to CSL 211 via a system bus 204. A random access memory ("RAM") 213 provides user memory in addition to that provided by CSL 211. Programmable inputs/outputs ("PIOs") 215 provide connection between CSL 211 and other resources (not shown) external to CSoC 110.

After configuration, various masters take control of system bus 204 to perform functions on CSoC 210. A master, such as central processing unit ("CPU") 214 (or other devices shown to the left of system bus 204), may need signals from CSL 211 to perform these functions.

Bidirectional bus 200 of one embodiment of the present invention provides an interface between circuitry of CSL 211 and system bus 204. For one embodiment, bidirectional bus 200 is located in CSL 211. The bidirectional bus 200 can selectively drive signals onto the general interconnect of CSL 211 as well as onto system bus 204. Multiple signals can use the bidirectional bus 200 without contention, resulting in a flexible interconnect routing resource.

Figure 1:
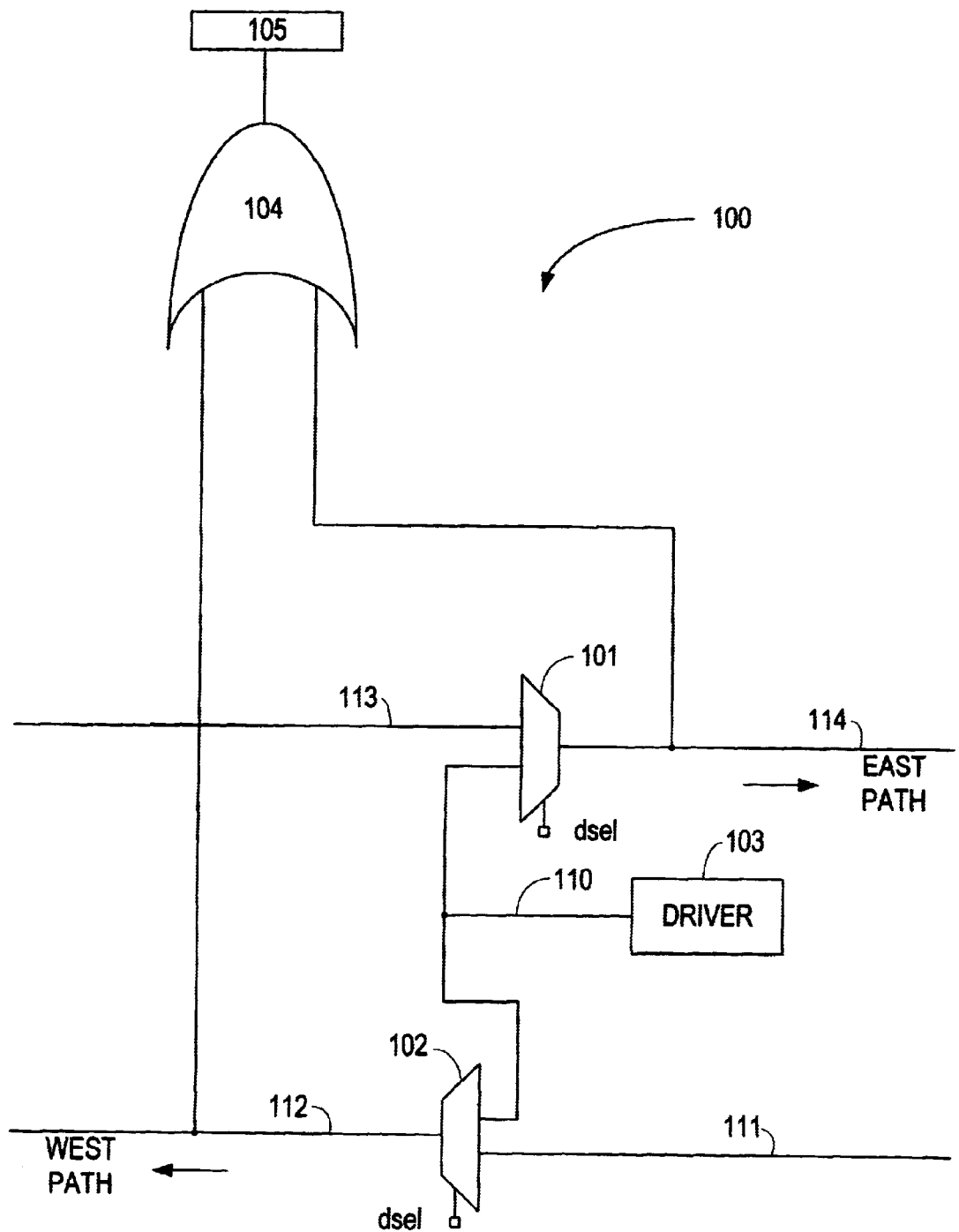
FIG. 1 is a simplified circuit diagram of a prior art bidirectional bus structure.
Figure 3:
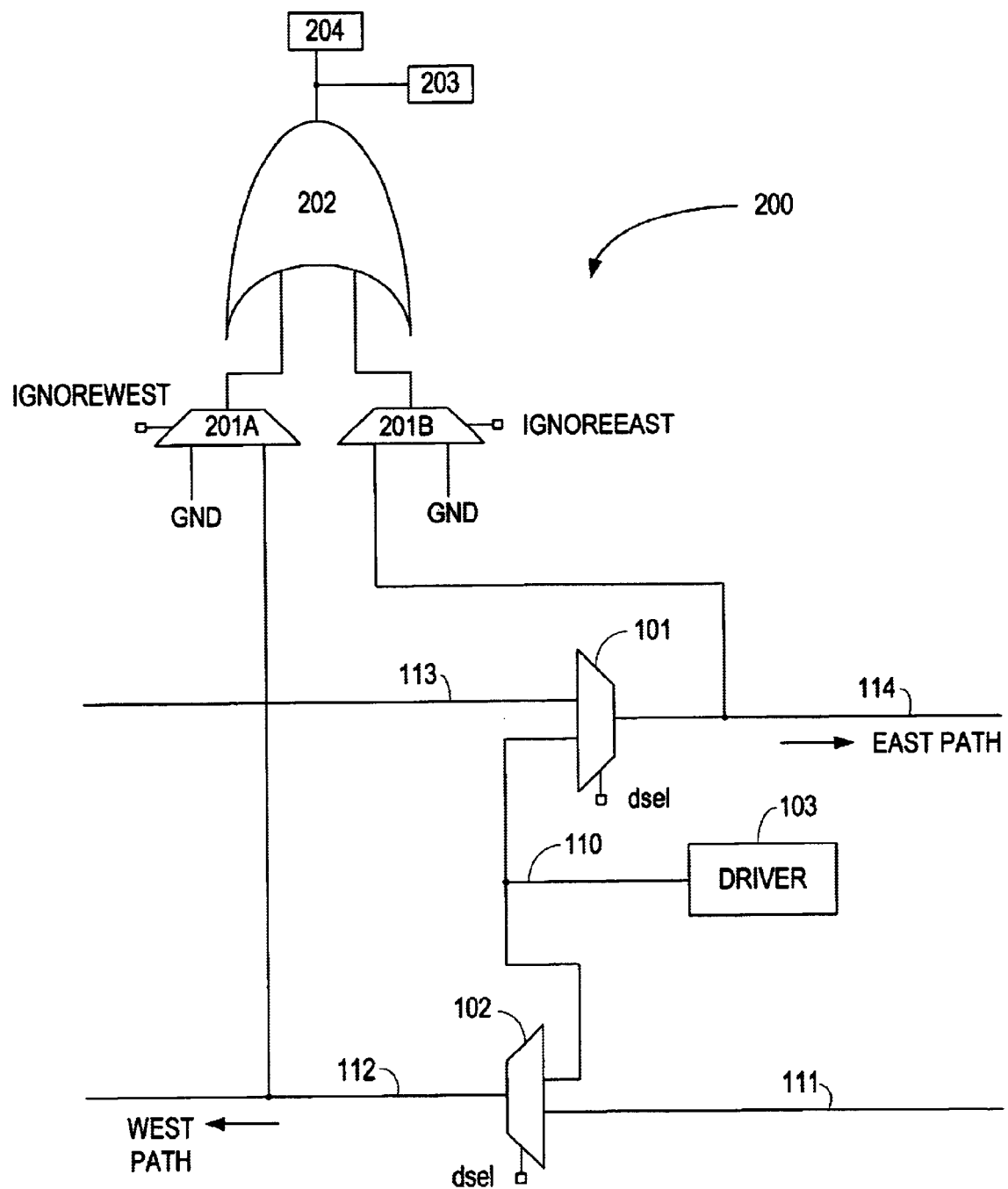
FIG. 3 is a simplified circuit diagram of a bidirectional bus structure of one embodiment of the present invention.

FIG. 3 illustrates one embodiment of a bidirectional bus 200 in accordance with the present invention. Bus 200 includes multiplexers 101 and 102. Multiplexers 101 and 102 respectively propagate signals on the East and West paths as described above in reference to FIG. 1. Bus driver 103 can include a single signal source, or multiple signal sources that are selectively controlled to ensure a single signal is provided on line 110.

Bus 200 further includes two multiplexers 201A and 201B. Multiplexers 201A and 201B receive input signals from multiplexers 102 and 101, respectively. Both multiplexers 201A and 201B receive a predetermined signal, in this case a logic zero (ground) signal. Multiplexers 201A and 201B are controlled by signals IgnoreWest and IgnoreEast. These control signals, typically provided by configuration memory cells, by user logic, or by control logic within CSoC 210, determine the functionality of bus 200.

Specifically, if both multiplexers 201A and 201B are programmed to drive the signals on the East 114 and West 112 paths to a logic gate 202, then logic gate 202 outputs a combined signal to the general interconnect 203 in CSL 211 as well as to system bus 204. For one embodiment, logic gate 202 is an OR gate. Thus, the "combined signed" that is output from logic OR gate 202 is a logical OR of the outputs of multiplexers 201A and 201B.

For one embodiment, multiple tap points (i.e., multiple logic gates 202) provide the same combined signal along the total length of bus 200. In this manner, bus 200 functions as a standard bus with additional, single signal interconnect routing capability.

In accordance with the present invention, bus 200 can also advantageously be used as a multi-signal interconnect routing resource. For example, if only multiplexer 201A selectively drives the predetermined signal (i.e., ground) to logic gate 202, then logic gate 202 provides the signal from the East path 114 as an output signal from logic gate 202. Thus, another signal can be propagated on the West path 112.

In a similar manner, if only multiplexer 201B selectively drives the predetermined signal (i.e., ground) to logic gate 202, then logic gate 202 provides the signal from the West path 112 as an output signal, thereby allowing another signal to propagate on the East path 114. Note that the predetermined signal (i.e., ground) is provided as an output signal of logic gate 202 if both multiplexers 201A and 201B drive the predetermined signal to logic gate 202.

Therefore, any number of signals can be driven onto the East 114 and West 112 paths and selectively accessed using multiplexers 201A and 201B. In this multi-signal interconnect mode, multiplexers 101 and 102 prevent signal contention.

Bus 200 can be used as an interconnect routing resource for routing multiple signals as long as the following conditions are satisfied:

(1) when one of multiplexers 101 and 102 is used in the bypass mode, the corresponding multiplexer cannot be used in the inject mode (as shown in FIG. 3, this is ensured by having signal dsel control both multiplexers 101 and 102);

(2) when one of multiplexers 101 and 102 is used in the inject mode, the corresponding multiplexer cannot be used in the bypass mode (once again, this configuration is ensured by signal dsel controlling both multiplexers 101 and 102);

(3) when a signal uses the East path 114 as the interconnect, the ignorewest signal is used to cause multiplexer 201A to provide the predetermined signal (i.e., logic zero) as an output from multiplexer 201A to logic gate 202; and (4) when a signal uses the West path 112 as the interconnect, the ignoreEast signal is used to cause multiplexer 201B to provide the predetermined signal (i.e., logic zero) as an output from multiplexer 201B to logic gate 202.

Figure 4:
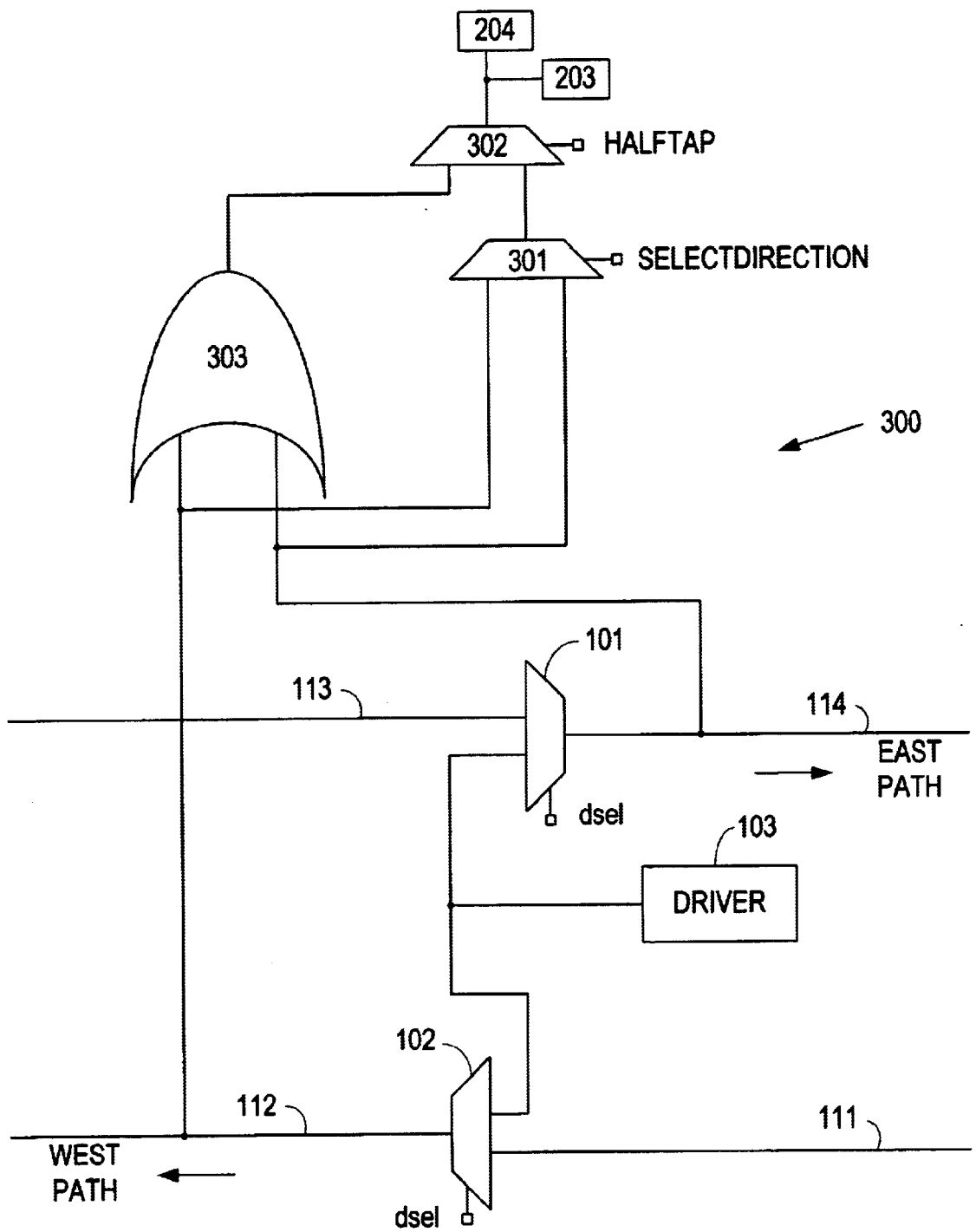
FIG. 4 is a simplified circuit diagram of another embodiment of the bidirectional bus structure of the present invention.

FIG. 4 illustrates a bidirectional bus 300, which is another embodiment of the present invention. Bus 300 includes a logic gate 303 and a multiplexer 301 that both receive input signals directly from the East path 114 and the West path 112. For one embodiment, logic gate 303 is an OR gate. Bus 300 further includes a multiplexer 302 that receives as input signals the outputs from the logic gate 303 and multiplexer 301. In this configuration, multiplexer 302 selectively propagates either (1) a logical OR (provided by gate 303) of the signals from the East 114 and West 112 paths (2) or one of signals from the East 114 and West 112 paths (as determined by multiplexer 301). The logical OR of the signals from the East 114 and West 112 paths is also referred to as the combined signal from the East and West paths.

Signals SelectDirection and HalfTap, which respectively control multiplexers 301 and 302, are provided by configuration memory cells, user logic, or control logic in CSoC 202. For this embodiment of the present invention, any number of signals can be driven onto the East 114 and West 112 paths and selectively accessed using multiplexers 301 and 302.

Although logic gates 202 and 303 are shown as OR gates, other logic gates may be used to provide similar functionality.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A bus structure comprising:
    a bi-directional multiplexer chain, wherein a link of the chain includes a first multiplexer propagating signals in a first direction and a second multiplexer propagating signals in a second direction; and
    a circuit for receiving at least one control signal and the signals of the first and second multiplexers, and selectively propagating an output signal of one of the first and second multiplexers based on the at least one control signal, wherein the circuit includes:
        a third multiplexer for receiving the output signal of the first multiplexer and a predetermined signal;
        a fourth multiplexer for receiving the output signal of the second multiplexer and the predetermined signal; and
        a logic gate for receiving output signals of the third and fourth multiplexers.

2. The bus structure of claim 1, wherein the predetermined signal is ground and the logic gate is an OR gate.

3. The bus structure of claim 1, further including a bus driver, wherein the first and second multiplexers selectively receive output signals of the bus driver.

4. The bus structure of claim 1, wherein the circuit provides an output-signal to a system bus of a configurable system on a chip.

5. The bus structure of claim 1, wherein the circuit provides an output signal to a programmable interconnect.

6. The bus structure of claim 1, wherein the at least one control signal is provided by configuration memory cells, by user logic, or by control logic.

7. A bus structure comprising:
    a bi-directional multiplexer chain, wherein a link of the chain includes a first path propagating signals in a first direction and a second path propagating signals in a second direction, wherein the signals propagating in the first direction are different than the signals propagating in the second direction;
    a circuit to combine the signals on the first and second paths; and
    a multiplexer circuit for receiving at least one control signal and the signals on the first and second paths, and selectively propagating the signal on one of the first and second paths based on the at least one control signal.

8. The bus structure of claim 7, wherein the multiplexer circuit provides an output signal to a system bus of a configurable system on a chip.

9. The bus structure of claim 7, wherein the multiplexer circuit provides an output signal to a programmable interconnect.

10. The bus structure of claim 7, wherein the at least one control signal is provided by configuration memory cells, by user logic, or by control logic.

11. A bus structure comprising:
    a bi-directional multiplexer chain, wherein a link of the chain includes a first path propagating signals in a first direction and a second path propagating signals in a second direction;
    a logic gate for combining the signals on the first and second paths; and
    a multiplexer circuit for receiving at least one control signal, the signals on the first and second paths, and an output signal of the logic gate, and selectively propagating the signal on one of the first path, the second path, and the output signal of the logic gate based on the at least one control signal.

12. The bus structure of claim 11, wherein the multiplexer circuit provides an output signal to a system bus of a configurable system on a chip.

13. The bus structure of claim 11, wherein the multiplexer circuit provides an output signal to a programmable interconnect.

14. The bus structure of claim 11, wherein the at least one control signal is provided by configuration memory cells, by user logic, or by control logic.

15. A method of accessing at least one of multiple signals on a bi-directional bus, the bus including a first path propagating signals in a first direction and a second path propagating signals in a second direction, the method comprising:
    receiving at least one control signal;
    receiving signals propagating in the first direction;
    receiving signals propagating in the second direction; wherein the signals propagating in the first direction are different than the signals propagating in the second direction;
    combining the signals on the first and second paths to provide a combined signal; and
    selectively propagating one of the signal on the first path, the signal on the second path, and the combined signal based on the at least one control signal.

16. The method of claim 15, wherein the at least one control signal is provided by configuration memory cells, user logic, or control logic.

17. An apparatus, comprising:
    means for accessing at least one of multiple signals on a bi-directional bus, the bus including a first path propagating signals in a first direction and a second path propagating signals in a second direction;
    means for receiving at least one control signal;
    means for receiving signals propagating in the first direction;
    means for receiving signals propagating in the second direction; wherein the signals propagating in the first direction are different than the signals propagating in the second direction;
    means for combining the signals on the first and second paths to provide a combined signal; and
    means for selectively propagating one of the signal on the first path, the signal on the second path, and the combined signal based on the at least one control signal.

18. The apparatus of claim 17, wherein the at least one control signal is provided by configuration memory cells, user logic, or control logic.

* * * * *